United States Patent
Nakamura et al.

(10) Patent No.: US 6,988,312 B2
(45) Date of Patent: Jan. 24, 2006

(54) METHOD FOR PRODUCING MULTILAYER CIRCUIT BOARD FOR SEMICONDUCTOR DEVICE

(75) Inventors: Jyunichi Nakamura, Nagano (JP);
Shunichiro Matsumoto, Nagano (JP);
Tadashi Kodaira, Nagano (JP);
Hironari Aratani, Nagano (JP);
Takanori Tabuchi, Nagano (JP);
Takeshi Chino, Nagano (JP); Kiyotaka Shimada, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 99 days.

(21) Appl. No.: 10/451,850

(22) PCT Filed: Oct. 29, 2002

(86) PCT No.: PCT/JP02/11237

§ 371 (c)(1),
(2), (4) Date: Nov. 14, 2003

(87) PCT Pub. No.: WO03/039219

PCT Pub. Date: May 8, 2003

(65) Prior Publication Data

US 2004/0074088 A1 Apr. 22, 2004

(30) Foreign Application Priority Data

Oct. 31, 2001 (JP) .................................. 2001-334733

(51) Int. Cl.
*H05K 3/26* (2006.01)

(52) U.S. Cl. ..................... 29/830; 29/839; 29/840; 29/896; 29/852; 174/255

(58) Field of Classification Search .............. 29/830, 29/834, 840, 846, 852; 174/255
See application file for complete search history.

(56) References Cited

U.S. PATENT DOCUMENTS

| 5,426,849 A | * | 6/1995 | Kimbara et al. ............... 29/830 |
| 6,418,615 B1 | | 7/2002 | Rokugawa et al. |
| 6,441,314 B2 | | 8/2002 | Rokugawa et al. |
| 2002/0001937 A1 | | 1/2002 | Kikuchi et al. |

FOREIGN PATENT DOCUMENTS

| JP | 9-283925 | 10/1997 |
| JP | 11-26938 | 1/1999 |
| JP | 2001-68858 | 3/2001 |
| JP | 2001-185653 | 7/2001 |

* cited by examiner

*Primary Examiner*—Carl J. Arbes
(74) *Attorney, Agent, or Firm*—Staas & Halsey LLP

(57) ABSTRACT

The invention relates a method for producing a multilayer circuit board (50) for a semiconductor device, comprising using a composite metal sheet (14) in which two metal sheets are combined, forming, on each side of the composite metal sheet, pads for connecting to a semiconductor element, the pads being made of a metal material which is substantially not etched by an etchant for the metal sheet, and an insulating layer having openings exposing the pads, forming, on the insulating layer, a wiring line layer (26) connected to the pads and having pads for connecting to another wiring line layer to be subsequently formed, subsequently fabricating a multilayer circuit board body (20) by necessary numbers of insulating layers and wiring line layers alternately formed, forming, on the outermost insulating layer of the multilayer circuit board body, an insulating layer provided with through-holes exposing pads for external connecting terminals, which are located on the outermost insulating layer, then dividing the composite metal sheet, to yield intermediates (34) each provided on one side of the metal sheet with the multilayer circuit board body, and etching the metal sheet at an area at which a semiconductor element is to be mounted to remove the material of the metal sheet at that area, to thereby form a frame (10) surrounding the area for the mounting of the semiconductor element.

27 Claims, 12 Drawing Sheets

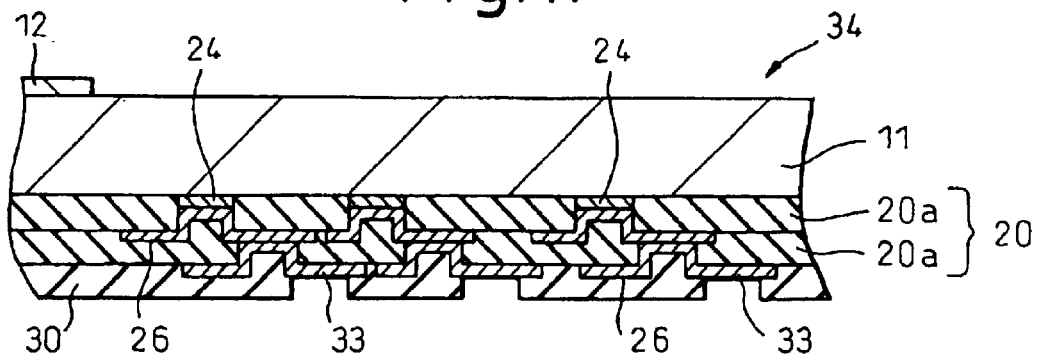
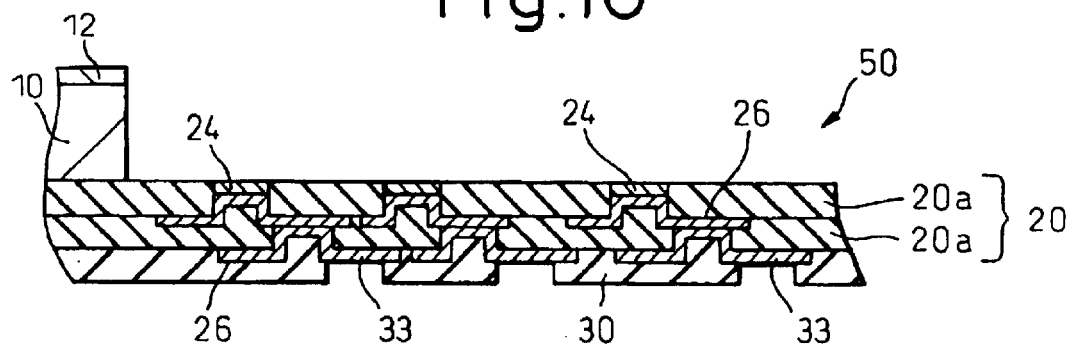
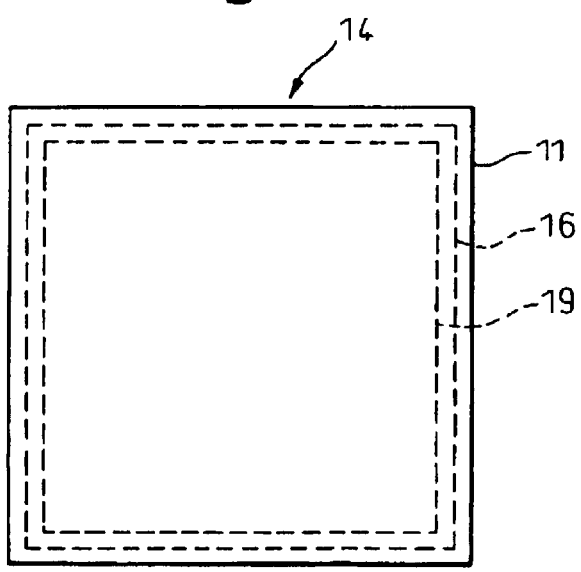

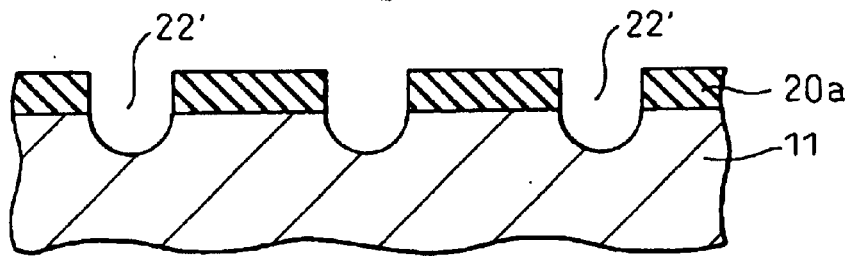
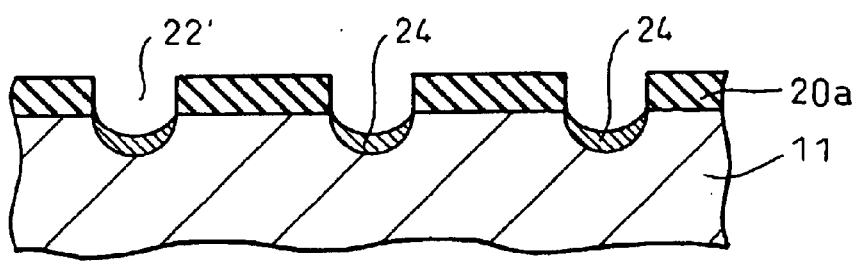
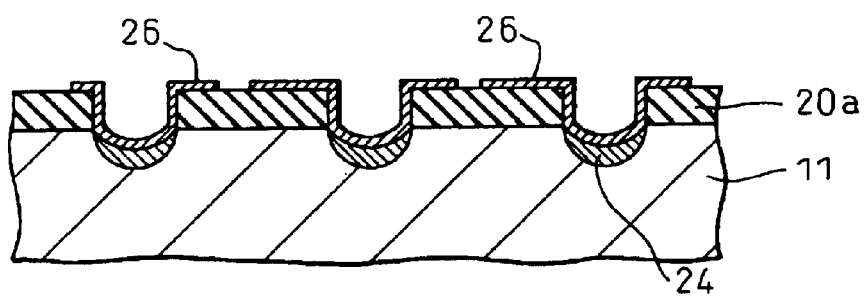
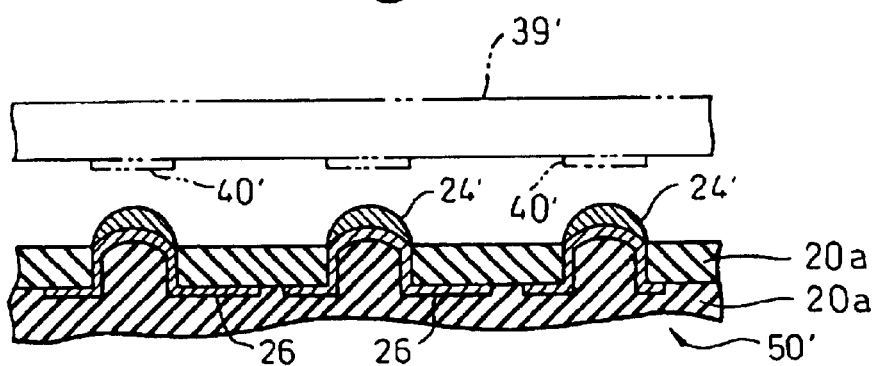

METHOD FOR PRODUCING MULTILAYER CIRCUIT BOARD FOR SEMICONDUCTOR DEVICE

TECHNICAL FIELD

The invention relates to a method for producing a multilayer circuit board for a semiconductor device and, more particularly, to a method for producing a multilayer circuit board for a semiconductor device which has a multilayer circuit board body formed of a plurality of sets of conductor layers and insulating layers, i.e., a stack of conductor layers and insulating layers formed alternately, the multilayer circuit board body having a side for mounting a semiconductor element thereon, and another side for external connecting terminals, the side for mounting a semiconductor element thereon being provided with pads through which the multilayer circuit board is connected to the semiconductor element to be mounted, and the side for external connecting terminals being provided with pads through which the multilayer circuit board is connected to external electrical circuits.

BACKGROUND ART

JP-2000-323613-A (which corresponds to U.S. Pat. No. 6,418,615) proposes a multilayer circuit board for a semiconductor device shown in FIG. 13. The multilayer circuit board 100 for a semiconductor device shown in FIG. 13 includes a multilayer circuit board body 105 having conductor wiring lines 102 stacked with intervening insulating layers 104 made of a resin such as polyimide or polyphenylene ether. One side of the multilayer circuit board body 105 is a side for mounting a semiconductor element thereon, on which side pads 120a for connecting to a semiconductor element, to which the electrode terminals 108 of a semiconductor element 106 to be mounted is to be connected, are formed, and the other side of the multilayer circuit board body 105 is a side for fixing external connecting terminals thereon, on which side pads 124 for external connecting terminals, on each of which a solder ball 122, as an external connecting terminal, is to be fixed, are formed. The semiconductor element-mounting side and the external connecting terminal-fixing side of the multilayer circuit board body 105 are covered with a solder resist 126, except for the semiconductor element-connecting pads 120a and the pads 124 for external connecting terminals.

In such a multilayer circuit board body 105, the conductor wiring lines 102 and/or the pads (the pads 120 for connecting layers of wiring lines to each other, the pads 124 for external connecting terminals, or the semiconductor element-connecting pads 120a) are electrically connected to each other through vias 128 penetrating the insulating layers 104. The via 128 is formed in an aperture 130 which is opened at the side of an insulating layer 104 facing the external connecting terminal-fixing side, and has a bottom defined by the face of the conductor wiring line 102 or pad 120, 120a formed at the side of the insulating layer 104 facing the semiconductor element-mounting side. In addition, a frame 117 having a given strength can be joined to the periphery of the multilayer circuit board body 105, so as to improve handleability, such as ease of carriage, of the multilayer circuit board 100 for a semiconductor device.

The multilayer circuit board 100 for a semiconductor device as shown in FIG. 13 can be produced by alternately forming the conductor wiring line layer and the insulating layer from the layer for mounting a semiconductor element having a face for mounting the semiconductor element in the direction of the layer for fixing external connecting terminals having a face for fixing the external connecting terminals, as described below by making reference to FIGS. 14 to 16.

First, a seed layer 142 is formed on a side of a copper sheet 140, as a metal sheet (FIG. 14A). As shown in FIG. 15, which is an enlarged view of the portion of the circle designated by A in FIG. 14A, the seed layer 142 is made of a chromium (Cr) layer 141a in direct contact with one face of the copper sheet 140, and a copper (Cu) layer 141b formed on the chromium layer 141a.

A photoresisit pattern (not shown) is formed on the seed layer 142 formed on the one face of the copper sheet 140, portions of the seed layer 142 at which semiconductor element-connecting pads 120a are to be formed are exposed, and semiconductor element-connecting pads 120a made of copper, to which the electrode terminals 108 of a semiconductor element 106 (FIG. 13) are subsequently connected, are then formed by electroplating using the seed layer 142, particularly the copper layer 141b, as a power supply layer (FIG. 14B).

A polyimide resin, which is a thermosetting resin, is applied by printing or the like so as to cover the semiconductor element-connecting pads 120a thus formed, and is cured to form an insulating layer 104 (FIG. 14C). Subsequently, openings 130 are formed in the insulating layer 104 by a beam of laser light, such as light of a YAG laser or a carbon dioxide laser (FIG. 14D).

A seed layer 142' made of a chromium layer and a copper layer is formed on the entire surface of the insulating layer 104 (FIG. 14E), including the faces of the inside walls of the openings 130 formed. Next, members representing vias 128 and conductor wiring lines 102 (FIG. 13) are formed using a resist pattern (not shown) formed on the seed layer 142' as a mask and by electroplating using the seed layer 142' as a power supply layer.

As shown in FIG. 14F, vias 128 and conductor wiring lines 102 are then formed on the surface of the insulating layer 104 by removing the seed layer 142', at the portions other than members representing vias 128 and conductor wiring lines 102, by etching.

Subsequently, by repeating the steps of FIGS. 14C to 14F, the conductor wiring line layers and the insulating layers can be alternately formed from the side of the layer for mounting a semiconductor element having a face for mounting a semiconductor element thereon in the direction of the layer for fixing external connecting terminals having a face for fixing the external connecting terminals thereon, to provide an intermediate 100a shown in FIG. 16. The resultant intermediate 100a has a multilayer circuit board body 105 having the face for mounting a semiconductor element thereon having the semiconductor element-connecting pads 120a formed, to which face the copper sheet 140 is joined through the seed layer 142, and has, at the opposed side, pads 124 formed for external connecting terminals. The copper sheet 140 fills the role of a reinforcing sheet for the intermediate 100a, and can facilitate handling, such as carriage, of the intermediate 100a.

To finally obtain the multilayer circuit board 100 for a semiconductor device shown in FIG. 13, it is necessary to remove the copper sheet 140 from the intermediate 100a by etching. Due to the fact that the seed layer has, as a member, the chromium layer 141a which is not etched by an etchant for the copper sheet 140, the progress of etching can be blocked during the etching of the copper sheet 140 when the etching reaches the chromium layer 141*a* of the seed layer 142, and the etching of the copper sheet 140 will be finished when the whole surface of the chromium layer 141*a* of the seed layer 142 is exposed. Subsequently, by removing the chromium layer 141*a* and the copper layer 141*b* by etching, the surfaces of the semiconductor element-connecting pads 120*a* can be exposed, to thereby provide the multilayer circuit board 100 for a semiconductor device shown in FIG. 13.

According to the method for producing a multilayer circuit board for a semiconductor device described making reference to FIGS. 14 to 16, a multilayer circuit board for a semiconductor device can be obtained, the multilayer circuit board has a face for mounting a semiconductor element thereon which is as flat as possible and has a thickness which is as small as possible. However, it has been found that the intermediate 110*a* shown in FIG. 16 can be warped due to a difference between the coefficients of thermal expansion of the copper sheet 140 and the insulating layers 104 of a resin, or the like. Subjecting a warped intermediate 110*a* to subsequent processing is not permitted in view of obtaining a highly reliable semiconductor device.

On the other hand, using a copper sheet 140 having a large thickness to prevent a warp takes a very long time to process in the step of removing substantially the entire copper sheet 140 by etching to expose the surface of semiconductor element-connecting pads 120*a* of the multilayer circuit board body 105, and cannot be industrially employed.

A warp during a production process can be prevented by forming insulating layers needed for a multilayer circuit board to be produced on one side of a copper sheet and forming the same number of insulating layers, as dummy layers, on the other side, to form the same number of insulating layers on both sides of the copper sheet. However, the insulating layers formed on the other side of the copper sheet are dummy layers between which conductor wiring lines are not formed, and are primarily not needed, make the production process complex.

Thus, an object of the invention is to provide a method for producing a multilayer circuit board for a semiconductor device, whereby a multilayer circuit board for a semiconductor device having a face for mounting a semiconductor element thereon which is as flat as possible and has a thickness which is as small as possible can be readily obtained by preventing warping during the production process thereof.

DISCLOSURE OF THE INVENTION

The inventors have found that two intermediates, in which a multilayer circuit board body is formed on one side of a metal sheet, can be obtained without the occurrence of substantial warp, by forming a multilayer circuit board body on each side of a composite metal sheet having two metal sheets laminated, and then dividing the composite metal sheet, and have conceived of the invention.

In other words, the invention resides in a method for producing a multilayer circuit board for a semiconductor device, the multilayer circuit board having a multilayer circuit board body formed of a plurality of sets of conductor layers and insulating layers, i.e., a stack of conductor layers and insulating layers formed alternately, and having a side for mounting a semiconductor element thereon, and another side for external connecting terminals, the side for mounting a semiconductor element thereon being provided with pads through which the multilayer circuit board is connected to the semiconductor element to be mounted, and the side for external connecting terminals being provided with pads through which the board is connected to external electrical circuits, and the multilayer circuit board body being provided, on the side for mounting a semiconductor element thereon, with a frame surrounding an area for mounting the semiconductor element thereat, the method comprising:

fabricating a composite metal sheet by combining two metal sheet face to face with each other, forming, on each of the sides of the composite metal sheet, pads for connecting to a semiconductor element, the pads being made of a metal material which is substantially not etched by an etchant for the metal sheet, and an insulating layer having openings exposing the pads, forming, on the insulating layer, a wiring line layer connecting to the pads through the openings, the wiring line layer being provided with pads for connecting to another wiring line layer to be subsequently formed, carrying out, a required number of times, the step of forming an insulating layer having openings exposing the pads for connecting to the another wiring line layer, and a wiring line layer connecting through the openings to pads of the another wiring line layer, which is located under the insulating layer, and being provided with pads for connecting to still another wiring line layer to be subsequently formed or pads for external connecting terminals, to fabricate a multilayer circuit board body having predetermined numbers of wiring line layers and insulating layers, forming, on the outermost insulating layer of the multilayer circuit board body, an insulating layer provided with through-holes exposing the pads for external connecting terminals, which are located on the outermost insulating layer, dividing the composite metal sheet, to yield intermediates each provided on one side of the metal sheet with the multilayer circuit board body, and etching the metal sheet at an area at which a semiconductor element is to be positioned for the mounting thereof to remove the material of the metal sheet at that area, to thereby form a frame surrounding the area for the mounting of the semiconductor element.

As the metal sheet, a metal sheet having a film of a metal material, which is hard to etch by an etchant for the metal sheet, provided on the side to be faced another metal sheet for the fabrication of the composite metal sheet, can be used. The film of the metal material on the metal sheet, which is hard to etch by an etchant for the metal sheet, can be removed at the area of the intermediate at which a semiconductor element is to be positioned for the mounting thereof, to expose the metal sheet, and the material of the metal sheet at the above area can be removed by etching using the remaining metal material film as a mask.

It is also possible to use a metal sheet not provided with a film of a metal material which is hard to etch by an etchant for the metal sheet. In this case, it is necessary to use a resist film or a mask plate during the etching of the metal sheet.

The insulating layer provided with through-holes exposing the pads for external connecting terminals can be formed by joining to the outermost insulating layer of the multilayer circuit board body a metal sheet having the entire surface, including the inside wall faces of through-holes, subjected to an insulation treatment. The insulation-treated metal sheet located on the external connecting terminals-fixing side of the multilayer circuit board along with the frame on the semiconductor element-mounting side sandwiches the multilayer circuit board body therebetween, whereby a warp, which the multilayer circuit board body can be encountered during the production process, can be prevented. The insulation-treated metal sheet also contributes to the improvement of the strength of a multilayer circuit board finally obtained.

Joining the insulation-treated metal sheet to the outermost insulating layer of the multilayer circuit board body can be carried out by the use of an adhesive. Preferably, the adhesive contains insulating fine particles having a diameter capable of forming a gap between the outermost insulating layer of the multilayer circuit board body and the insulation-treated metal sheet after the joining, the gap being capable of preventing the adhesive from being pressed out into the through-hole of the insulation-treated metal sheet.

In lieu of the insulation-treated metal sheet (reinforcing sheet), a ceramic sheet or a resin sheet having a strength and a coefficient of thermal expansion adapted to those of the frame (reinforcing sheet) on the semiconductor element-mounting side may be joined to the external connecting terminals-fixing side.

In the invention, the pads for connecting to a semiconductor element can also be formed as bump-like pads protruding from the surface of the outermost insulating layer, by forming an insulating layer having openings on each of the sides of the composite metal sheet, removing the part of the metal sheet material exposed at the bottom of the opening to form a concavity having a bottom in the metal sheet, and forming a solder layer at the bottom of the concavity by electroplating using the metal sheet as a power supply layer.

Alternatively, the pads for connecting to a semiconductor element can also be formed as pads having a structure difficult to remove from the multilayer circuit board body, the pads protruding from the surface of the outermost insulating layer and having a tapered and constricted lower section, by irradiating the insulating layer formed on each of the sides of the composite metal sheet with a beam of laser light to form openings in the insulating layer, the openings having a bottom having a diameter which is smaller than the diameter at the surface of the insulating layer, etching the metal sheet exposed at the bottom of the opening to form, in the metal sheet, a cavity having a diameter at the location, through which the cavity communicates with the opening, which is equal to or larger than the diameter of the bottom of the opening, and filling the cavity and the opening with solder.

In this case, filling with solder can be carried out by electroplating using the metal sheet in which the cavities are formed as a power supply layer, or by the use of a solder paste.

The outermost insulating layer at the external connecting terminals-fixing side of the multilayer circuit board body may be formed of a glass cloth prepreg.

In the invention, a multilayer circuit board for a semiconductor device having a semiconductor element-mounting side containing pads for connecting to a semiconductor element exposed, can be produced by, after obtaining the intermediate which is provided on one side of the metal sheet with the multilayer circuit board body, fully removing the metal sheet from the intermediate by etching. By joining a frame to the exposed semiconductor element-mounting side, a multilayer circuit board for a semiconductor device provided on a semiconductor element-mounting side of the multilayer circuit board body with a frame surrounding the area on which a semiconductor element is to be mounted can also be produced.

BRIEF DESCRIPTION OF THE DRAWINGS

FIGS. 1A to 1G illustrate an example of the method for producing a multilayer circuit board for a semiconductor device of the invention.

FIG. 2 is an illustration of a metal sheet used in the production method shown in FIGS. 1A to 1G.

FIGS. 9A to 9D illustrate a second example of the method for producing a multilayer circuit board for a semiconductor device of the invention.

BEST MODE FOR CARRYING OUT THE INVENTION

An example of the method for producing a multilayer circuit board for a semiconductor device of the invention is shown in FIGS. 1A to 1G. In the production method shown in FIGS. 1A to 1G, copper sheets 11 having a thickness of about 0.3 millimeter are used as the two metal sheets, and a nickel film 12 is formed on one side of each of them. The nickel film 12 is a film of a metal which is hard to etch by an etchant for the copper sheet 11. The nickel film 12 can be formed by plating, sputtering or the like.

Figure 1A:
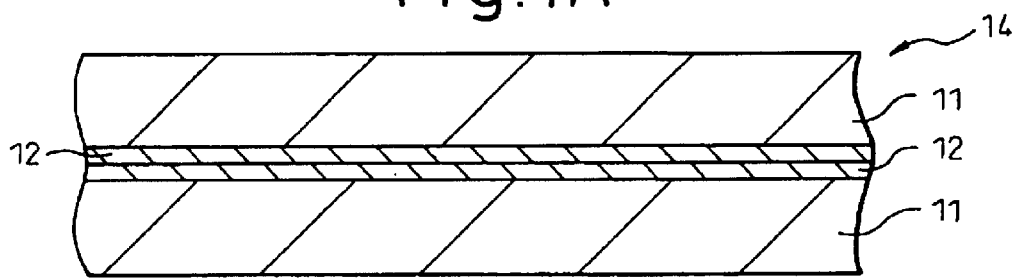

The two copper sheets 11 having the nickel film 12 thus formed on the one side of each of them are laminated and integrated to form a composite metal sheet 14, so that the nickel films 12 are inside the composite (FIG. 1A). The composite metal sheet 14 is formed by bonding the vicinities of the peripheries of the copper sheets 11 (the area from the edge to the broken line 16) to each other by an adhesive for the integration, as shown in FIG. 2. The composite metal sheet 14 can be easily separated into the discrete copper sheets 11 by cutting it along the broken line 18 at the inside vicinity of the area bonded by the adhesive, as described below.

Figure 1B:
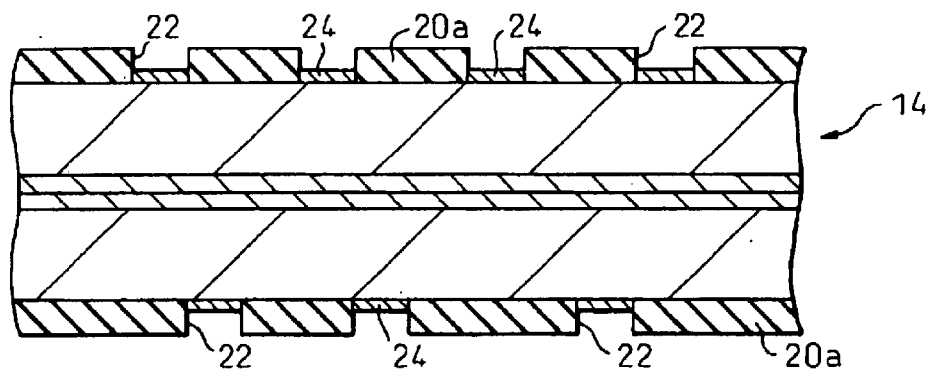
Figure 1C:
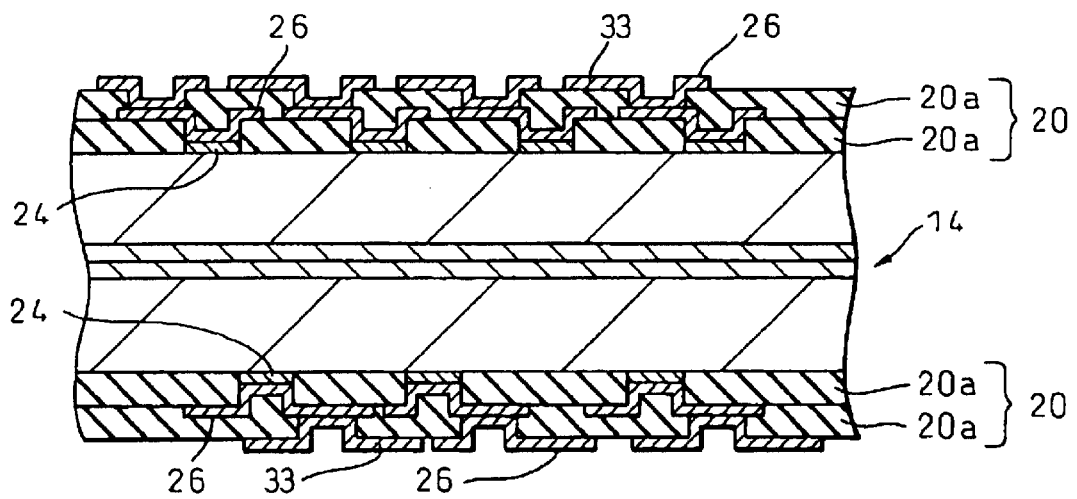
Figure 1D:
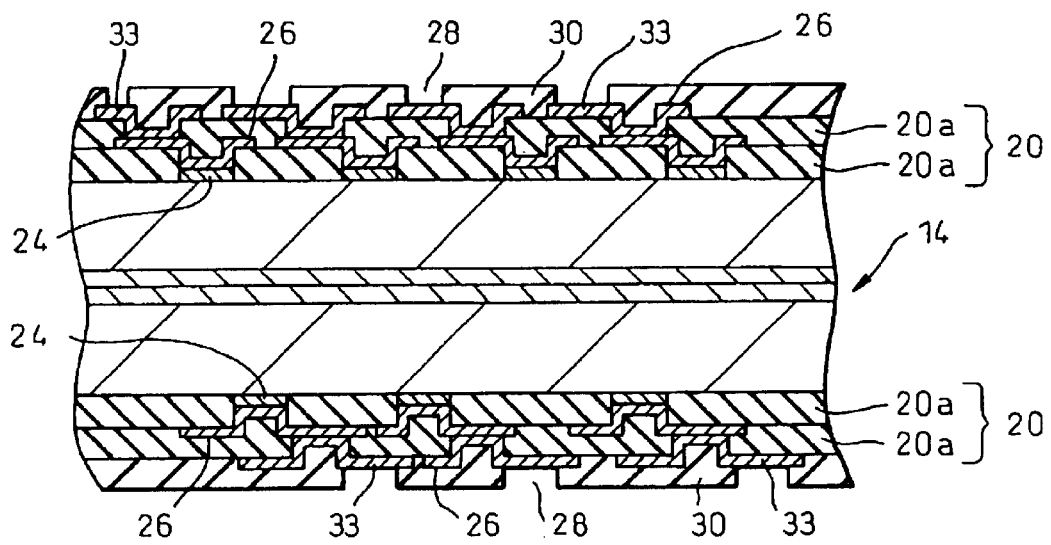

As shown in FIG. 1B, a thermosetting resin or a photosensitive resin, such as a polyimide or epoxy resin, is applied to both sides of the composite metal sheet 14 by printing or the like, and is cured to form insulating resin layers 20a. Openings 22 for the formation of vias are formed in the insulating resin layers 20a by a beam of laser light, such as a beam of YAG laser or carbon dioxide laser light, or a photolithography process. Solder layers 24 are formed at the bottoms of the openings 22 by electroplating using the copper sheets 11, parts of which are exposed at the bottoms of the respective openings 22, as power supply layers. Alternatively, openings 22 having solder layers 24 exposed at their bottoms can be formed by forming solder layers 24 at the parts of the copper sheets 11 at which pads for connecting to a semiconductor element are to be formed, then forming insulating resin layers 20a which cover the solder layers 24 and, subsequently, using a beam of laser light or a photolithography process. The solder layer 24 is a layer made of a metal that is not substantially etched by an etchant for the copper sheet 11, and configures a pad for connecting to a semiconductor element. The insulating resin layer 20a may be formed by the attachment of a film made of a resin, such as a polyimide or epoxy resin.

Multilayer circuit board bodies 20 (FIG. 1C) having a predetermined number of wiring line layers are then fabricated by alternately forming conductor wiring line layers 26 and insulating resin layers 20a on both sides of the composite metal sheet 14, by a commonly known method.

The formation of the conductor wiring line layer 26 can be carried out as follows, for example. On the previously formed insulating layer 20a, a copper layer, which communicates, through the opening 22 formed in the insulating layer 20a, with the underlying solder layer 24 or wiring line layer 26, is formed by a plating or sputtering process. A resist pattern is formed on the copper layer, and a conductor wiring line layer 26, including vias, is formed by electroplating with copper using the resist pattern as a mask and the copper layer as a power supply layer. Subsequently, the resist pattern is removed, and the copper layer is etched for removal at portions other than portions representing the conductor wiring line layer 26 including vias (the copper layer formed by plating or sputtering prior to the electroplating with copper).

The formation of the insulating resin layer 20a can be carried out by, for example, forming an insulating resin film made of a thermosetting resin, such as a polyimide or epoxy resin, on the formed conductor wiring line layer 26, and forming openings 22 for the formation of vias in the insulating resin film by a beam of YAG laser light or the like.

Figure 3A:
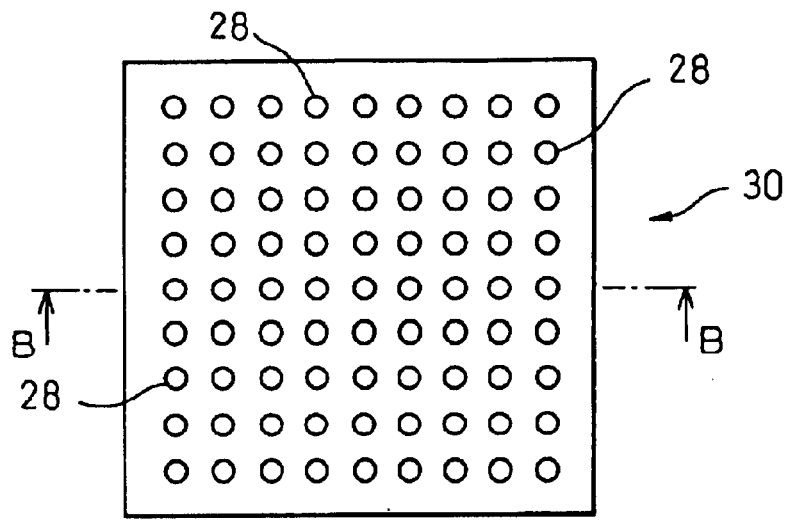
FIG. 3A is a top view of an insulation-treated metal sheet used in the production method shown in FIGS. 1A to 1G.
Figure 3B:
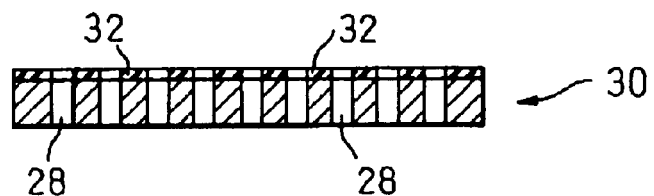
FIG. 3B is a cross sectional view taken along the line B—B of FIG. 3A.

An insulation-treated metal sheet 30 is bonded onto the wiring line layer 26 including pads 33 for external connecting terminals at the outermost layer of each of the multilayer circuit board bodies 20 formed on both sides of the composite metal sheet 14 (FIG. 1D), using an adhesive (not shown). The insulation-treated metal sheet 30 forms an outermost insulating layer at the external connecting terminals-fixing side in a finished multilayer circuit board. The insulation-treated metal sheet 30 has through-holes 28 at the locations corresponding to the pads 33 for external connecting terminals, as shown in FIG. 3A, and is covered the entire surface, including the inside wall surfaces of the thorough-holes 28, with an insulating film (not shown). In addition, the side of the insulation-treated metal sheet 30 to be joined to the multilayer circuit board body 20 is covered, in advance, with an adhesive 32.

Figure 4:
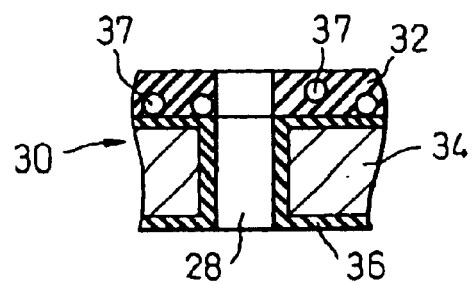
FIG. 4 is an enlarged partial cross sectional view of the vicinity of a through-hole of the insulation-treated metal sheet shown in FIGS. 3A and 3B.

In FIG. 4, an enlarged partial cross sectional view of the vicinity of the through-hole 28 of the insulation-treated metal sheet 30 is shown. The insulating layer 36 is formed on the entire surface of the insulation-treated metal sheet 30, including the inside wall surfaces of the thorough-holes 28. In the case of the metal sheet 30 made of aluminum, the insulating layer 36 may be a layer of alumite ($Al_2O_3$) obtained by anodizing. Alternatively, the insulating layer 36 may be a layer of an insulating resin.

Figure 5:
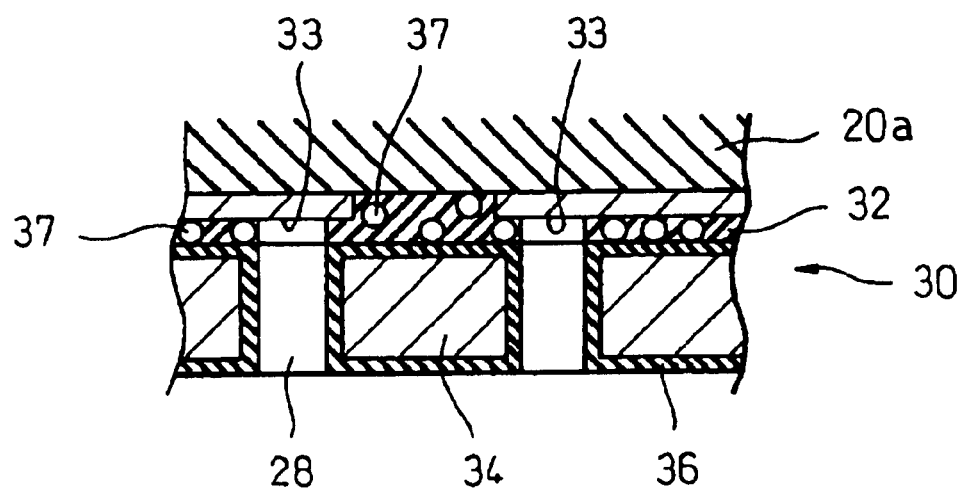
FIG. 5 is an illustration of the bonding of the insulation-treated metal sheet to a multilayer circuit board body.

An adhesive 32 having insulating fine particles 37 having a predetermined diameter blended is applied on the one side of the insulation-treated metal sheet 30, as shown in FIG. 4. The insulating fine particle 37 provides a gap between the insulation-treated metal sheet 30 and the insulating resin layer 20a even when the insulation-treated metal sheet 30 is pressed during bonding the insulation-treated metal sheet 30 to the outermost insulating resin layer 20a, as shown in FIG. 5, and prevents the adhesive 32 from being pressed out into the through-hole 28. Thus, it is necessary that the insulating fine particle 37 has a diameter capable of creating a gap between the insulation-treated metal sheet 30 and the insulating resin layer 20a, the gap being capable of preventing the adhesive 32 from being pressed out into the through-hole 28. Blending the insulating fine particles 37 with the adhesive 32 is not necessarily needed when a gap capable of preventing the adhesive 32 from being pressed out into the through-hole 28 is experimentally determined in advance for bonding the insulation-treated metal sheet 30 to the insulating resin layer 20a.

When the multilayer circuit board bodies 20 are thus formed on both sides of the composite metal sheet 14, the composite metal sheet 14 has an improved strength compared to the case of using a single copper sheet 11 for the formation of the multilayer circuit board body 20 and, in addition, even if there is a difference in coefficient of thermal expansion between the copper sheet 11 and the multilayer circuit board body 20 made up mainly of a resin, the directions of warp due to the difference in coefficient of thermal expansion between the copper sheet 11 and the multilayer circuit board body 20 are reverse to each other at two sides of the composite metal sheet 14, and thus warps occurring at the respective sides of the composite metal sheet 14 can cancel each other. Accordingly, the composite metal sheet 14 and the multilayer circuit board 20 are not substantially warped in the steps described with reference to FIGS. 1A to 1D, and alignment for the formation of the openings 22 for forming vias in the insulating resin layer 20a by a beam of YAG laser light or the like, or for the bonding of the insulation-treated metal sheet 30 to the insulating resin layer, can be carried out reliably and easily.

Figure 1E:
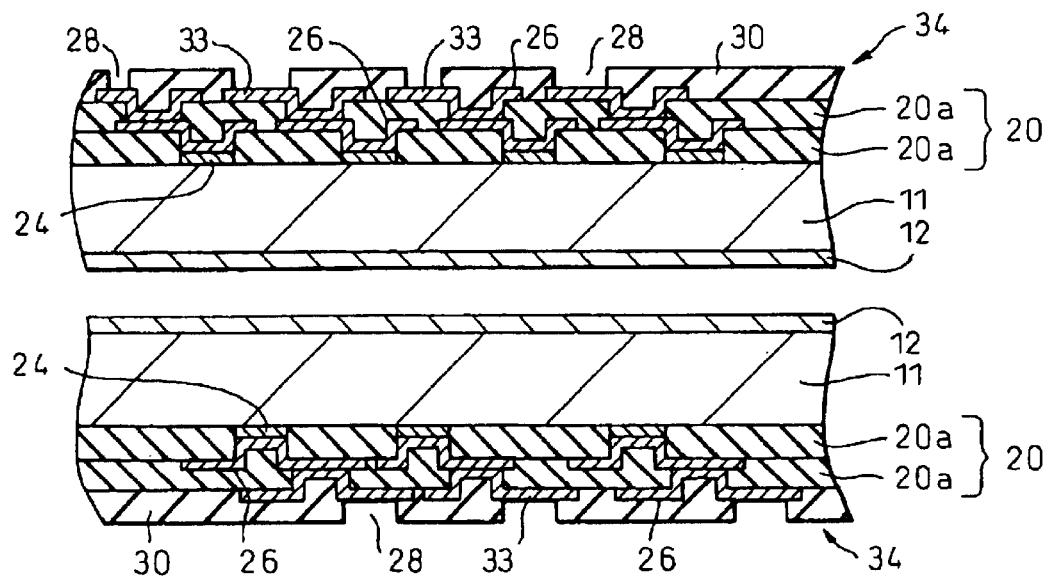

Following the bonding of the insulation-treated metal sheet 30, intermediates 34, each having a multilayer circuit board body 20 formed at one side of one copper sheet 11, can be obtained by separating the two copper sheets 11 constituting the composite metal sheet 14 having at each side the multilayer circuit board body 20, as shown in FIG. 1E. The separation of the two copper sheets 11 can be readily carried out by, as shown in FIG. 2, cutting the composite metal sheet 14 along a line (for example, the broken line 19 in the drawing) inside the peripheral area thereof (the area from the edge of the copper sheet 11 to the broken line 16 in the drawing) bonded with an adhesive.

In the intermediate 34 (FIG. 1E) thus obtained, as the multilayer circuit board body 20 made mainly of a resin is sandwiched between the copper sheet 11 and the insulation-treated metal sheet 30, the occurrence of warp can be prevented even if heat is applied.

As shown in FIG. 1F, the nickel film 12 located at the surface of the copper sheet 11 of the intermediate 34 is patterned to remove part thereof corresponding to an area for positioning a semiconductor element thereat, to thereby expose a central portion of the copper sheet 11. Subsequently, the exposed portion of the copper sheet 11 can be removed by etching using the remaining nickel film 12 as a mask, to provide a multilayer circuit board 50 for a semiconductor device in which a frame 10 made of copper is joined to the semiconductor element-mounting side of the multilayer circuit board body 20, as shown in FIG. 1G. During the etching of the copper sheet 11, a mask plate is provided on the external connecting terminals-fixing side of the multilayer circuit board body 20 having pads 33 for external connecting terminals formed. As an etchant for the copper sheet 11, an etchant which etches the copper sheet 11, but does not etch the solder layer 24, is used.

Figure 6:
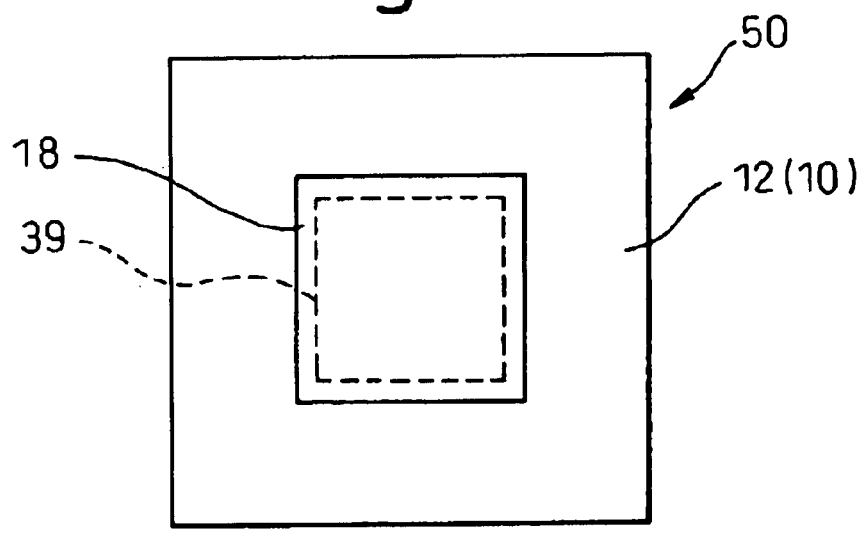
FIG. 6 is a top view of a frame used in the invention.

In the multilayer circuit board 50 for a semiconductor device thus fabricated, the frame 10 made of copper provided on the top face with the nickel film 12 remains, surrounding the area 18 on which a semiconductor element 39 is to be mounted, as shown in FIG. 6, and can serve as an reinforcing sheet for the multilayer circuit board 50 and improve the strength thereof.

Particularly, as the multilayer circuit board 50 for a semiconductor device obtained by the production method illustrated in FIGS. 1A to 1G has the multilayer circuit board 20 made mainly of a resin sandwiched between the frame 10 made of copper and the insulation-treated metal sheet 30, it can have a further enhanced strength.

As the conductor wiring lines 26 of the multilayer circuit board body 20 are formed by a process of stacking them from one side of the copper sheet 11 along with the insulating resin layers 20a interposed between adjacent wiring layers to form a stack of layers, the multilayer circuit board 50 for a semiconductor device obtained by the method of the invention can have the face, on which the semiconductor element 39 is to be mounted, formed to be as flat as possible, and the multilayer circuit board 50 can have as small a thickness as possible compared to a multilayer circuit board fabricated by a method in which a core substrate is used and a stack of conductor wiring line layers is formed on each side thereof.

Figure 7:
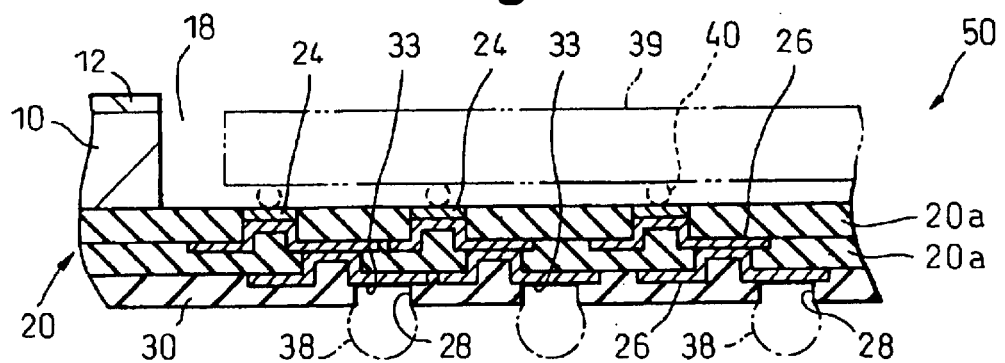
FIG. 7 is an illustration of a multilayer circuit board for a semiconductor device obtained according to the method of the invention.

As shown in FIG. 7, the multilayer circuit board 50 for a semiconductor device produced by the method of the invention can provide a packaged semiconductor device by applying solder balls 38, as external connecting terminals, to the pads 33 for the external connecting terminals through the through-holes 28 of the insulation-treated metal sheet 30, applying the electrode terminals 40 of the semiconductor element 39 to the solder layers 24 formed as the pads for connecting to a semiconductor element, and reflowing them.

Although the composite metal sheet 14, in which two copper sheets 11 having the nickel film 12, as a metallic film, formed on the one side of each of them are laminated and integrated so that the nickel films 12 are inside the composite, is used in the method for producing a multilayer circuit board for a semiconductor device previously described, a composite metal sheet, in which two copper sheets are integrated together without forming nickel films, may be used. In this case, during the removal of portion of the copper sheet forming an intermediate corresponding to the opening 18 (FIG. 6) for positioning a semiconductor element, etching must be carried out with an etching resist film being formed on or a mask plate being applied to the portion which is not etched (the portion becomes the frame 10).

Figure 8:
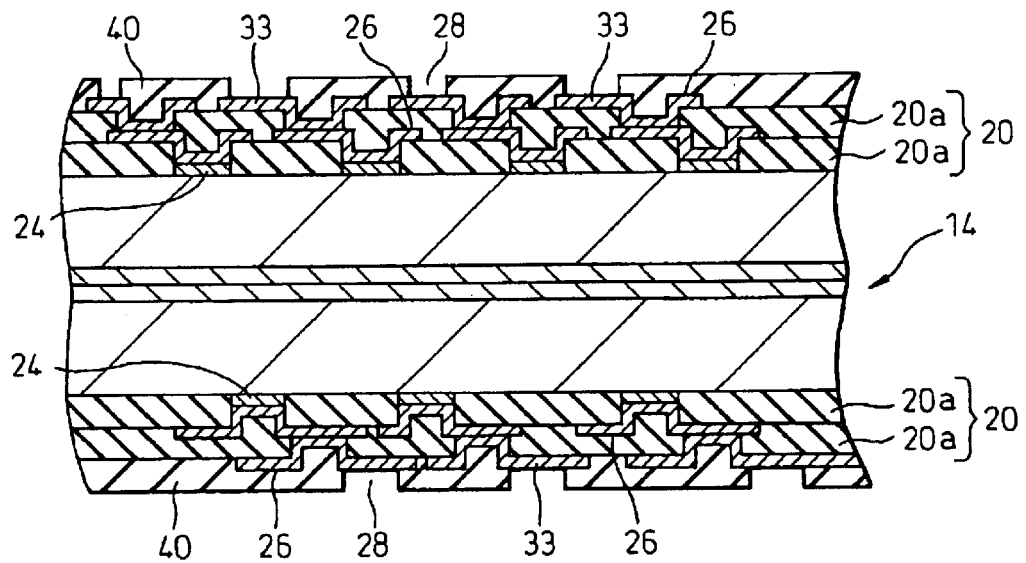
FIG. 8 shows a multilayer circuit board body provided with an outermost insulating layer formed by a solder resist in place of the insulation-treated metal sheet.

Also, although the insulation-treated metal sheet 30 is bonded to the top surface of the topmost insulating resin layer 20a constituting the multilayer circuit board body 20 in the method for producing a multilayer circuit board for a semiconductor device previously described, a solder resist 40 may be applied in place of the insulation-treated metal sheet, as shown in FIG. 8, when the warp of the multilayer circuit board body 20 can be prevented only by the copper sheet 11.

In the invention, as shown in a partially enlarged view of FIG. 9A, after the formation of openings for forming vias in the insulating resin layer 20a on the copper sheet 11 of the composite metal sheet, the parts of the copper sheet 11 exposed at the bottoms of the openings may be etched or laser-machined, to provide concavities 22' penetrating the insulating resin layer 20a and having bottoms formed within the copper sheet 11. Solder layers 24 for pads for mounting a semiconductor element are formed (FIG. 9B) by electroplating using the copper sheet 11 as a power supply layer, as shown in FIG. 9B, after which conductor wiring lines 26 can be formed (FIG. 9C) by a commonly known method.

In the multilayer circuit board 50' for a semiconductor device fabricated by such a method, bump-like pads 24' for connecting to a semiconductor element, which protrude from the surface of the outermost insulating resin layer 20a, can be formed, as shown in FIG. 9D. Using such a multilayer circuit board for a semiconductor device having bump-like pads 24' for a semiconductor element formed, even a semiconductor element 39' provided with electrode terminals 40' having flat ends can be easily and directly bonded to the multilayer circuit board for a semiconductor device through the bump-like pads 24'.

The vias of the multilayer circuit board 50 for a semiconductor device (FIG. 7) may be formed by filling the openings 22 (FIG. 1B) of the insulating resin layer 20a with a metal by plating. Also, a plurality of multilayer circuit board bodies 20 may be made on one of the copper sheets 11 constructing the composite metal sheet, to thereby produce a multitude of multilayer circuit boards for semiconductor device at the same time.

In the invention, further embodiments are also possible, as described below.

In an embodiment, the copper sheet, as the metal sheet used to make the multilayer circuit board body, can be totally removed, rather than being partially removed as described above.

Figure 10A:
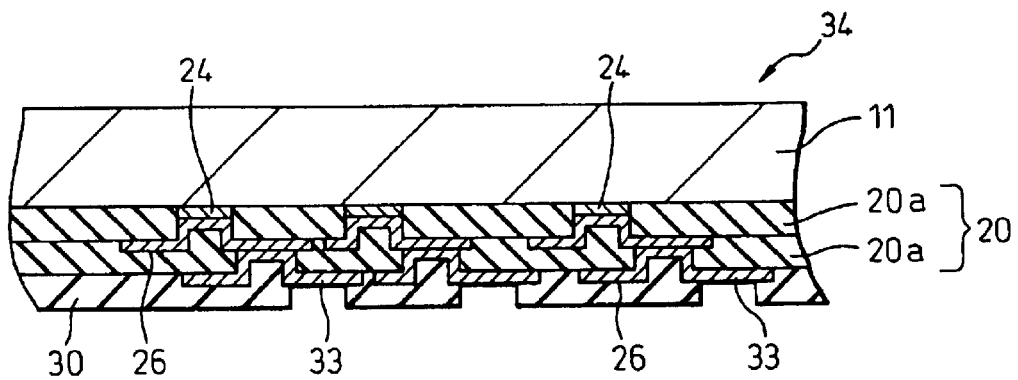
FIGS. 10A to 10C illustrate another example of the method for producing a multilayer circuit board for a semiconductor device of the invention.
Figure 10B:
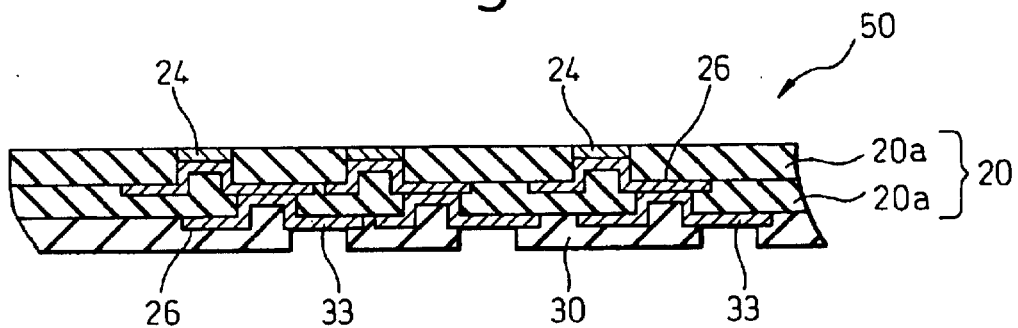
Figure 10C:
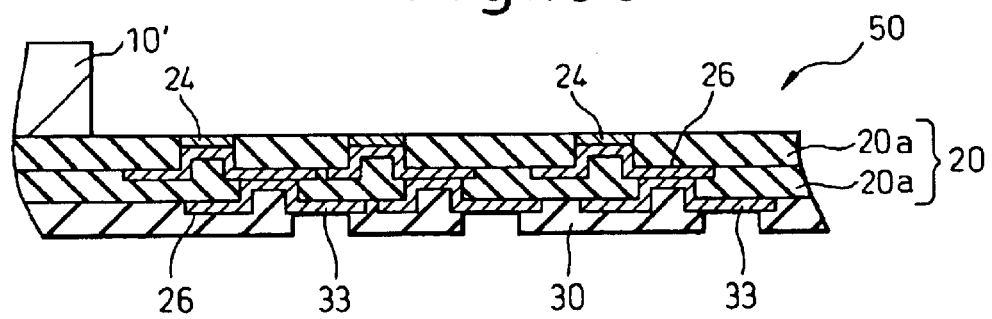

In this case, the entire copper sheet 11 (which does not need to be provided with a metal film, such as a nickel film, serving as a mask during the etching thereof) having a multilayer circuit board body 20 formed on one side thereof, as shown in FIG. 10, is removed by etching, to thereby expose the entire face of the semiconductor element-mounting side provided with the pads 24 for connecting to a semiconductor element, as shown in FIG. 10B. A distinct frame 10' may be attached to the semiconductor element-mounting side the entire face of which has been exposed, as shown in FIG. 10C. For the attachment of the frame 10', an adhesive (not shown) can be used. When the copper sheet 11 is completely removed before the attachment of the frame 10' as just described, a stress between the copper sheet 11 and the multilayer circuit board body 20, which occurs due to the difference between their coefficients of thermal expansion, is completely released by the removal of the copper sheet 11, prior to the attachment of the frame 10'. Consequently, a warp can be favorably prevented from developing in the multilayer circuit board for a semiconductor device.

Optimal materials for the frame 10' are thermosetting or thermoplastic resin-based materials. Exemplary resin materials can include polyimide resins, epoxy resins, glass cloth-containing epoxy resins, which are known as FR4, aramid-containing epoxy resins, and the like. A frame formed of a sheet of such a resinous material operates to release the stress of the multilayer circuit board body 20 during shrinkage while being attached to the multilayer circuit board body 20, and can avoid a warp. In the case where stress is not significant, a metal or ceramic sheet may be used as the frame 10'.

In another embodiment, bump-like pads for connecting to a semiconductor element each having a tapered and constricted lower section can be formed. The formation of the bump-like pad will now be described, making reference to FIGS. 11A to 11D, which show a copper sheet 11 and a first insulating resin layer 20a formed on one side thereof for simplicity.

Figure 11A:
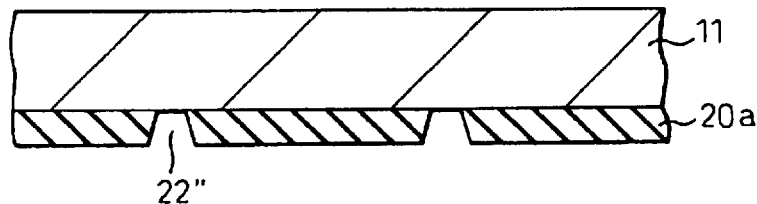
FIGS. 11A to 11D illustrate a further example of the method for producing a multilayer circuit board for a semiconductor device of the invention.
Figure 11B:
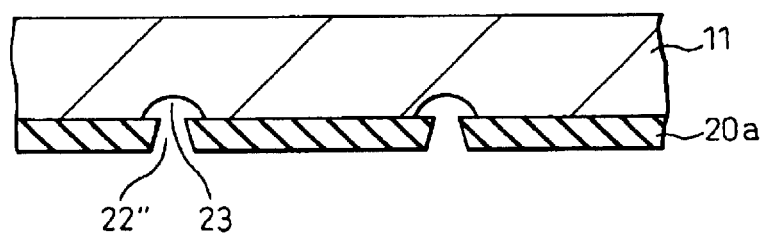
Figure 11C:
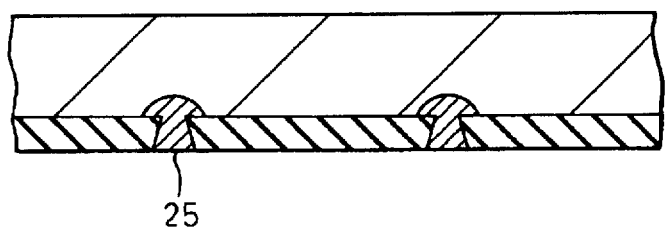
Figure 11D:
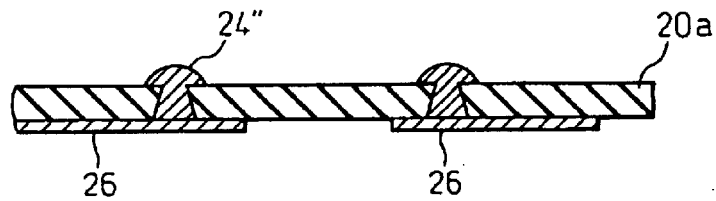

As shown in FIG. 11A, an opening 22" extending to the copper sheet 11 is formed in the resin layer 20a on the copper sheet 11 by a beam of laser light. The energy of laser light is high at the surface of the resin layer 20a closer to a source of light, and is low at the face of the copper sheet 11 farther from the source of light. Consequently, the formed opening 22", has a large diameter at the surface of the resin layer 20a, and a small diameter at the boundary face between it and the copper sheet 11, as shown in the drawing. By way of example, by an irradiating beam of laser light, an opening can be formed in a resin layer 20a having a thickness of 30 micrometers, the opening having a diameter of 70 micrometers at the surface of the resin layer, and a diameter of about 60 to 65 micrometers at the boundary face between it and the copper sheet 11. Subsequently, the part of the copper sheet 11 exposed at the bottom of the opening 22" is etched (isotropic etching), to thereby form a cavity 23 in the copper sheet 11, the cavity having a diameter at the location, through which the cavity communicates with the opening 22", which is equal to or larger than the diameter of the bottom of the opening 22", as shown in the drawing. For example, the cavity 23 can have a portion, through which it communicates with the opening 22", having a diameter of about 75 micrometers. Subsequently, the cavity 23 and the opening 22" are filled with solder 25 by electroplating using the copper sheet 11 as a power supply layer, as shown in FIG. 11C, and the copper sheet 11 is then removed by etching, whereby a bump-like pad 24" for connecting to a semiconductor element having a tapered and constricted lower section can be obtained, as shown in FIG. 11D. In FIG. 11D, a wiring line layer connected to the pad 24" is designated by 26.

If the layer 20a is formed of a photosensitive resin, a tapered opening is formed in the layer 20a by exposure, by which a bump-like pad 24" having a tapered and constricted lower section can be obtained.

It is also possible that the bump-like pad 24" is formed by filling the cavity 23 and the opening 22" with a solder paste, in lieu of electroplated solder, and then reflowing it. For the filling of the solder paste, a technique, such as screen printing, can be used. A flux component contained in the solder paste is lighter than a solder material, and rises during the reflowing, whereby it can be removed.

The bump-like pad 24" thus formed is difficult to remove from the multilayer circuit board body and, consequently, it can make the bonding between the multilayer circuit board and a semiconductor element mounted thereon strong, and can improve the reliability of a package having the semiconductor element mounted.

In an alternative embodiment, the outermost insulating layer at the external connecting terminals-fixing side of the multilayer circuit board for a semiconductor device can be formed using a glass cloth-containing insulating resin (glass cloth prepreg) or an aramid-containing insulating resin. In this case, as the external connecting terminals-fixing side of the multilayer circuit board is reinforced by a glass cloth prepreg, it is unnecessary to use an insulation-treated metal sheet having through-holes at the external connecting terminals-fixing side, as in the embodiment earlier described, and a solder resist layer can be formed so as to expose the pads for external connecting terminals.

The formation of the insulating layer using a prepreg can be readily carried out by attaching a prepreg, curing a resin by heating, and forming openings at the locations corresponding to underlying pads by, for example, a beam of laser light.

Figure 12:
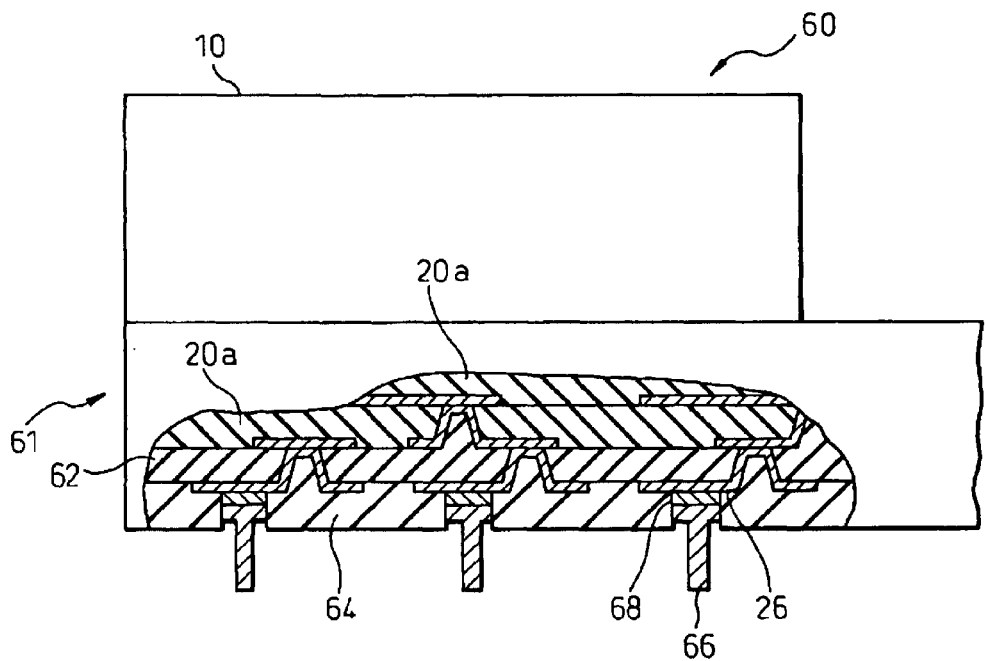
FIG. 12 is an illustration of a multilayer circuit board provided at the outermost layer at the external connecting terminals-fixing side with an insulating layer formed of a glass cloth prepreg, produced according to the method of the invention.
Figure 13:
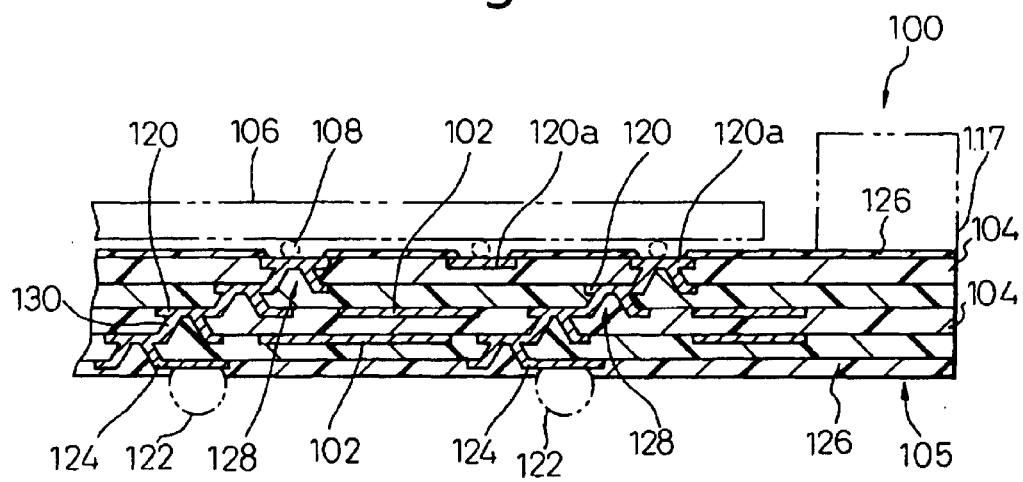
FIG. 13 is an illustration of a multilayer circuit board obtained by a prior method for producing a multilayer circuit board for a semiconductor device.
Figure 14A:
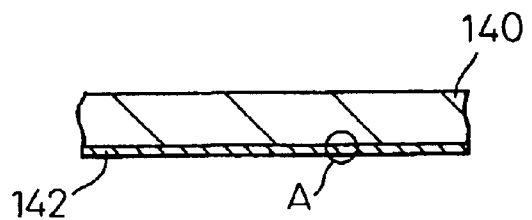
FIGS. 14A to 14F illustrate a prior method for producing a multilayer circuit board for a semiconductor device.
Figure 14B:
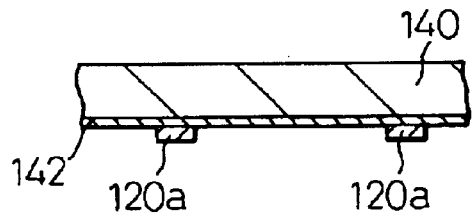
Figure 14C:
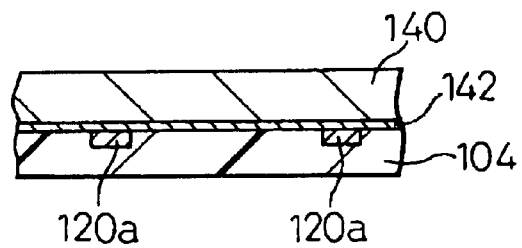
Figure 14D:
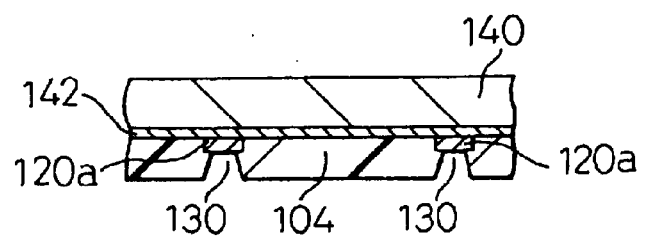
Figure 14E:
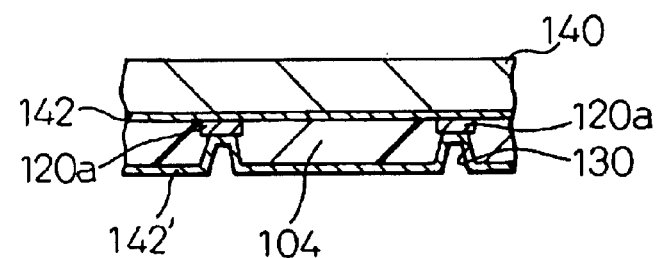
Figure 14F:
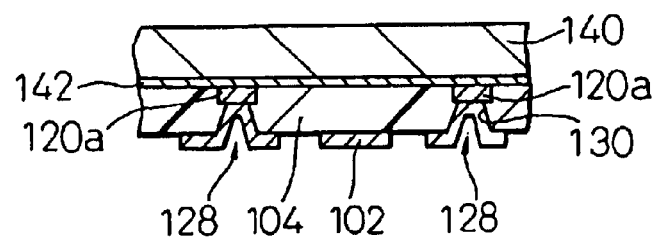
Figure 15:
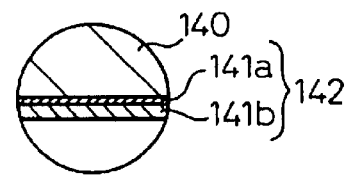
FIG. 15 an enlarged cross sectional view of the part indicated by the circle A in FIG. 14A, showing the construction of a seed layer on a metal sheet used in the conventional production of a multilayer circuit board for a semiconductor device.
Figure 16:
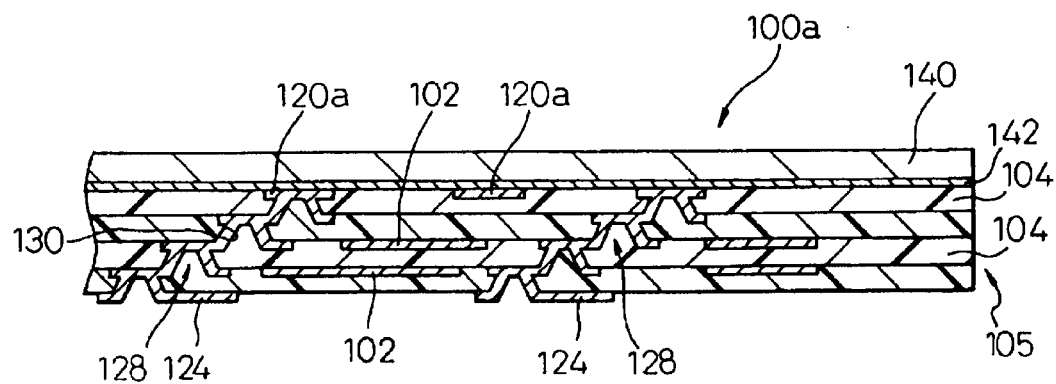
FIG. 16 is an illustration of an intermediate obtained by the prior method for producing a multilayer circuit board for a semiconductor device.

In FIG. 12, a multilayer circuit board 60 for a semiconductor device according to this embodiment is shown. The multilayer circuit board 60 has a multilayer circuit board body 61 having an insulating layer 62 formed of a glass cloth prepreg at the outermost layer of the external connecting terminals-fixing side, and a frame 10, as in the embodiment earlier described, at the semiconductor element-mounting side, and is provided at the external connecting terminals-fixing side with a protective layer 65 formed of a solder resist.

The multilayer circuit board 60 for a semiconductor device according to this embodiment is particularly advantageous when using, as at least part of the external connecting terminals, not bump-like terminals obtained by reflowing solder balls but pin-like terminals. As shown in FIG. 12, pin-like terminals 66 are fixed to the pads 33 of the multilayer circuit board 60 using solder 68. The solder 66 is generally applied to the pads 33 by screen printing. An insulation-treated metal sheet, such as those obtained by anodizing the surface of an aluminum sheet, usually has a thickness of the order of 100 to 200 micrometers, whereas a solder resist layer can be formed to have a thickness of the order of 10 to 20 micrometers. It is not preferred for screen printing that a printed surface has significant unevenness. By the use of a solder resist layer, the unevenness at the printed surface can be lowered.

In addition, using the solder resist layer in lieu of the insulation-treated metal sheet has another advantage. When the insulation-treated metal sheet is used, complicated operations of machining a metal sheet into a predetermined size, forming an insulating film on the surface thereof, and bonding it to a multilayer circuit board at a designated location, is needed. In contrast, in the case of a solder resist layer, it is possible to form the layer, with ease, by the application and patterning of a solder resist material.

INDUSTRIAL APPLICABILITY

As described, according to the invention, a warp of a multilayer circuit board body resulting from the difference between coefficients of thermal expansion of a metal sheet and the multilayer circuit board body in a process for the production of a multilayer circuit board for a semiconductor device using a metal sheet, can be prevented, and it becomes possible to provide highly reliable multilayer circuit board for semiconductor device.

Moreover, in the invention, by dividing a composite metal sheet having a multilayer circuit board body formed at each side, two intermediates each having a multilayer circuit board body formed at one side of one metal sheet can be obtained at the same time, which is superior in production efficiency compared to the case of the formation of a multilayer circuit board body using a single metal sheet.

What is claimed is:

1. A method for producing a multilayer circuit board for a semiconductor device, the multilayer circuit board having a multilayer circuit board body formed of predetermined numbers of wiring line layers and insulating layers, and having a side for mounting a semiconductor element thereon and another side for external connecting terminals, the side for mounting a semiconductor element being provided with pads through which the multilayer circuit board is connected to the semiconductor element to be mounted, and the side for external connecting terminals being provided with pads through which the multilayer circuit board is connected to external electrical circuits, and the multilayer circuit board body being provided, on the side for mounting a semiconductor element, with a frame surrounding an area for mounting the semiconductor element thereat, the method comprising:

fabricating a composite metal sheet by combining two metal sheet face to face with each other, forming, on each of the sides of the composite metal sheet, pads for connecting to a semiconductor element, the pads being made of a metal material which is substantially not etched by an etchant for the metal sheet, and an insulating layer having openings exposing the pads, forming, on the insulating layer, a wiring line layer connecting to the pads through the openings, the wiring line layer being provided with pads for connecting to another wiring line layer to be subsequently formed, carrying out, a required number of times, the step of forming an insulating layer having openings exposing the pads for connecting to the another wiring line layer, and a wiring line layer connecting through the openings to pads of the another wiring line layer, which is located under the insulating layer, and being provided with pads for connecting to still another wiring line layer to be subsequently formed or pads for external connecting terminals, to fabricate a multilayer circuit board body having the predetermined numbers of wiring line layers and insulating layers, forming, on the outermost insulating layer of the multilayer circuit board body, an insulating layer provided with through-holes exposing the pads for external connecting terminals, which are located on the outermost insulating layer, dividing the composite metal sheet, to yield intermediates each provided on one side of the metal sheet with the multilayer circuit board body, and etching the metal sheet at an area at which a semiconductor element is to be positioned for the mounting thereof to remove the material of the metal sheet at that area, to thereby form a frame surrounding the area for the mounting of the semiconductor element.

2. The method of claim 1, wherein, as the metal sheet, a metal sheet having a film of a metal material, which is hard to etch by an etchant for the metal sheet, provided on the side to be faced another metal sheet for the fabrication of the composite metal sheet is used, and wherein the film of the metal material on the metal sheet, which is hard to etch by an etchant for the metal sheet, is removed at the area of the intermediate at which a semiconductor element is to be positioned for the mounting thereof, to expose the metal sheet, and the material of the metal sheet at the above area is removed by etching using the remaining metal material film as a mask.

3. The method of claim 2, wherein the material of the metal sheet is copper, and the material of the film formed thereon is nickel.

4. The method of claim 1 wherein, during the etching of the metal sheet at an area at which a semiconductor element is to be positioned for the mounting thereof, a portion of the metal sheet not to be etched is protected by a resist film or by a mask plate.

5. The method of claim 1, wherein the insulating layer provided with through-holes exposing the pads for external connecting terminals is formed by joining to the outermost insulating layer of the multilayer circuit board body a metal sheet having the entire surface, including the inside wall faces of through-holes, subjected to an insulation treatment.

6. The method of claim 5, wherein, as the insulation treated metal sheet, a sheet made of aluminum, the surface of which is insulation-treated by anodizing, is used.

7. The method of claim 5, wherein the joining is carried out using an adhesive.

8. The method of claim 7, wherein the adhesive contains insulating fine particles having a diameter capable of forming a gap between the outermost insulating layer of the multilayer circuit board body and the insulation-treated metal sheet after the joining, the gap being capable of preventing the adhesive from being pressed out into the through-hole.

9. The method of claim 1, wherein the pads for connecting to a semiconductor element is formed as pads protruding from the surface of the outermost insulating layer, by forming an insulating layer having openings on each side of the composite metal sheet, removing the part of the metal sheet material exposed at the bottom of the opening to form a concavity having a bottom in the metal sheet, and forming a solder layer at the bottom of the concavity by electroplating using the metal sheet as a power supply layer.

10. The method of claim 1, wherein the pads for connecting to a semiconductor element is formed as pads having a structure difficult to remove from the multilayer circuit board body, the pads protruding from the surface of the outermost insulating layer, by forming openings in the insulating layer formed on each side of the composite metal sheet, the openings having a bottom having a diameter which is smaller than the diameter at the surface of the insulating layer, etching the metal sheet exposed at the bottom of the opening to form, in the metal sheet, a cavity having a diameter at the location, through which the cavity communicates with the opening, which is equal to or larger than the diameter of the bottom of the opening, and filling the cavity and the opening with solder.

11. The method of claim 10, wherein the filling with solder is carried out by electroplating using the metal sheet as a power supply layer.

12. The method of claim 10, wherein the filling with solder is carried out using a solder paste.

13. The method of claim 1, wherein the outermost insulating layer in the multilayer circuit board body is formed of a glass cloth prepreg or an aramid-containing prepreg.

14. The method of claim 1, wherein the insulating layer provided with the through-holes exposing the pads for external connecting terminals is formed by a solder resist.

15. A method for producing a multilayer circuit board for a semiconductor device, the multilayer circuit board having a multilayer circuit board body formed of predetermined numbers of wiring line layers and insulating layers, and having a side for mounting a semiconductor element thereon and another side for external connecting terminals, the side for mounting a semiconductor element being provided with pads through which the multilayer circuit board is connected to the semiconductor element to be mounted, and the side for external connecting terminals being provided with pads through which the multilayer circuit board is connected to external electrical circuits, the method comprising:

fabricating a composite metal sheet by combining two metal sheets face to face with each other, forming, on each of the sides of the composite metal sheet, pads for connecting to a semiconductor element, the pads being made of a metal material which is substantially not etched by an etchant for the metal sheet, and an insulating layer having openings exposing the pads, forming, on the insulating layer, a wiring line layer connecting to the pads through the openings, the wiring line layer being provided with pads for connecting to another wiring line layer to be subsequently formed, carrying out, a required number of times, the step of forming an insulating layer having openings exposing the pads for connecting to the another wiring line layer, and a wiring line layer connecting through the openings to pads of the another wiring line layer, which is located under the insulating layer, and being provided with pads for connecting to still another wiring line layer to be subsequently formed or pads for external connecting terminals, to fabricate a multilayer circuit board body having the predetermined numbers of wiring line layers and insulating layers, forming, on the outermost insulating layer of the multilayer circuit board body, an insulating layer provided with through-holes exposing the pads for external connecting terminals, which are located on the outermost insulating layer, dividing the composite metal sheet, to yield intermediates each provided on one side of the metal sheet with the multilayer circuit board body, and removing the metal sheet from the intermediate by etching, to expose the semiconductor element-mounting side containing the pads for connecting to a semiconductor element.

16. The method of claim 15, further comprising joining a frame to the exposed semiconductor element-mounting side.

17. The method of claim 15, wherein the material of the metal sheet is copper.

18. The method of claim 15, wherein the insulating layer provided with through-holes exposing the pads for external connecting terminals is formed by joining to the outermost insulating layer of the multilayer circuit board body a metal sheet having the entire surface, including the inside wall faces of through-holes, subjected to an insulation treatment.

19. The method of claim 18, wherein, as the insulation treated metal sheet, a sheet made of aluminum, the surface of which is insulation-treated by anodizing, is used.

20. The method of claim 18, wherein the joining is carried out using an adhesive.

21. The method of claim 20, wherein the adhesive contains insulating fine particles having a diameter capable of forming a gap between the outermost insulating layer of the multilayer circuit board body and the insulation-treated metal sheet after the joining, the gap being capable of preventing the adhesive from being pressed out into the through-hole.

22. The method of claim 15, wherein the pads for connecting to a semiconductor element is formed as pads protruding from the surface of the outermost insulating layer, by forming an insulating layer having openings on each side of the composite metal sheet, removing the part of the metal sheet material exposed at the bottom of the opening to form a concavity having a bottom in the metal sheet, and forming a solder layer at the bottom of the concavity by electroplating using the metal sheet as a power supply layer.

23. The method of claim 15, wherein the pads for connecting to a semiconductor element are formed as pads having a structure difficult to be removed from the multilayer circuit board body, the pads protruding from the surface of the outermost insulating layer, by forming openings in the insulating layer formed on each side of the composite metal sheet, the openings having a bottom having a diameter which is smaller than the diameter at the surface of the insulating layer, etching the metal sheet exposed at the bottom of the opening to form, in the metal sheet, a cavity having a diameter at the location, through which the cavity communicates with the opening, which is equal to or larger than the diameter of the bottom of the opening, and filling the cavity and the opening with solder.

24. The method of claim 23, wherein the filling with solder is carried out by electroplating using the metal sheet as a power supply layer.

25. The method of claim 23, wherein the filling with solder is carried out using a solder paste.

26. The method of claim 15, wherein the outermost insulating layer in the multilayer circuit board body is formed of a glass cloth prepreg or an aramid-containing prepreg.

27. The method of claim 15, wherein the insulating layer provided with the through-holes exposing the pads for external connecting terminals is formed by a solder resist.

* * * * *

UNITED STATES PATENT AND TRADEMARK OFFICE
CERTIFICATE OF CORRECTION

PATENT NO. : 6,988,312 B2
APPLICATION NO. : 10/451850
DATED : January 24, 2006
INVENTOR(S) : Jyunichi NAKAMURA et al.

It is certified that error appears in the above-identified patent and that said Letters Patent is hereby corrected as shown below:

In the specification, colum 11, line 35, after 22" delete ",".

Signed and Sealed this

Eighth Day of August, 2006

JON W. DUDAS
*Director of the United States Patent and Trademark Office*